United States Patent [19]
Kambe et al.

[11] Patent Number: 5,938,979
[45] Date of Patent: Aug. 17, 1999

[54] ELECTROMAGNETIC SHIELDING

[75] Inventors: Nobuyuki Kambe, Menlo Park; Xiangxin Bi, San Ramon, both of Calif.

[73] Assignee: NanoGram Corporation, Fremont, Calif.

[21] Appl. No.: 08/962,359

[22] Filed: Oct. 31, 1997

[51] Int. Cl.$^6$ .............. H01B 1/20; H01B 1/12; H05K 9/00
[52] U.S. Cl. .............. 252/500; 252/516; 252/518.1; 252/521.2; 174/126.2; 174/35 R; 174/35 MS; 428/924
[58] Field of Search .............. 252/62.51, 62.54, 252/62.56, 518.1, 516, 521.2; 428/692, 928, 545, 924; 174/126.2, 35 R, 35 MS; 338/205

[56] References Cited

U.S. PATENT DOCUMENTS

| | | | |
|---|---|---|---|
| 3,406,228 | 10/1968 | Hardy et al. | 264/5 |
| 3,954,945 | 5/1976 | Lange et al. | 423/336 |
| 4,048,290 | 9/1977 | Kam Bor Lee | 423/336 |
| 4,371,742 | 2/1983 | Manly | 174/36 |
| 4,468,474 | 8/1984 | Gupta et al. | 502/5 |
| 4,548,798 | 10/1985 | Rice | 423/263 |
| 4,554,291 | 11/1985 | Gupta et al. | 518/700 |
| 4,705,762 | 11/1987 | Ota et al. | 501/87 |
| 4,840,926 | 6/1989 | Saburi et al. | 501/134 |
| 4,963,291 | 10/1990 | Bercaw | 252/512 |
| 5,013,706 | 5/1991 | Schramm et al. | 502/309 |
| 5,075,034 | 12/1991 | Wanthanl | 252/511 |
| 5,091,268 | 2/1992 | Nishikawa et al. | 428/694 |
| 5,207,878 | 5/1993 | Shimo et al. | 204/157.41 |
| 5,225,110 | 7/1993 | Kathirgamanathan | 252/512 |
| 5,264,157 | 11/1993 | Bidan et al. | 252/519 |
| 5,266,109 | 11/1993 | Voelker et al. | 106/459 |
| 5,358,695 | 10/1994 | Helble et al. | 423/592 |
| 5,366,664 | 11/1994 | Varadan et al. | 252/512 |
| 5,417,956 | 5/1995 | Moser | 423/592 |
| 5,447,708 | 9/1995 | Helble et al. | 423/593 |
| 5,519,585 | 5/1996 | Jones et al. | 361/818 |
| 5,554,678 | 9/1996 | Katsumata et al. | 524/495 |
| 5,617,095 | 4/1997 | Kim et al. | 342/1 |
| 5,714,536 | 2/1998 | Ziolo et al. | 524/430 |
| 5,783,263 | 7/1998 | Majotich et al. | 427/580 |

FOREIGN PATENT DOCUMENTS

| | | |
|---|---|---|
| 0717 418 A2 | 6/1996 | European Pat. Off. |
| 62-052129 A2 | 3/1987 | Japan . |
| 63-012198 | 1/1988 | Japan . |
| 7058489 | 3/1995 | Japan . |
| 8165147 | 6/1996 | Japan . |
| 1039633 | 8/1966 | United Kingdom . |

OTHER PUBLICATIONS

Andres et al., J. Mater. Res., vol. 4, No. 3, pp. 704–736 (May/Jun. 1989).
Bi et al., J. Mater. Res., vol. 8, No. 7, pp. 1666–1674 (Jul. 1993).
Curcio et al., Applied Surface Science, vol. 46, pp. 225–229 (1990) No Month.
Joo et al., Appl. Phys. Lett., vol. 65, No. 18, pp. 2278–2280 (Oct. 31, 1994).
Musci et al., J. Mater. Res., vol. 7, No. 10, pp. 2846–2852 (Oct. 1992).
Gregory P. Smith, SPIE, vol. 458, pp. 11–16 (1984).
Fuh et al., Jpn. J. Appl. Phys., vol. 33, Part 2, No. 6B, pp. L870–L872 (Jun. 1994).

*Primary Examiner*—Mark Kopec
*Attorney, Agent, or Firm*—Westman Chaplin & Kelly, P.A.; Peter S. Dardi

[57] ABSTRACT

Electromagnetic shielding material is formed from a shielding composition made with magnetic particles and a binder, where the magnetic particles have an average diameter less than about 1000 nm and are substantially crystalline. The magnetic particles can be formed from $Fe_2O_3$, $Fe_3O_4$, $Fe_3C$, or $Fe_7C_3$. The shielding composition can be formed into a layer or into composite particles. The binder can be a metal or an electrically conducting polymer. A conducting layer can be placed adjacent to the shielding composition. The shielding material can be used to protect sensitive electronic devices. Methods are described for forming iron oxide particles by laser pyrolysis.

15 Claims, 4 Drawing Sheets

ELECTROMAGNETIC SHIELDING

FIELD OF THE INVENTION

The invention relates to magnetic particles used for electromagnetic interference shielding and composite materials incorporating these magnetic particles. The invention further relates to methods for producing the magnetic particles.

BACKGROUND OF THE INVENTION

With advances in telecommunication such as the development of mobile personal digital equipment (phones, pagers, etc.) new technical issues have arisen relating to shielding from the resulting electromagnetic interference (EMI). In particular, EMI from electronic and telecommunication equipment has been found to cause significant malfunctions of, for example, medical equipment in hospitals and consumer electronics. In addition, health concerns have been raised with regard to exposure of individuals to EMI. Because of these problems, regulations have been enacted for manufacturers of electronic and telecommunication equipment to assure a certain level of EMI shielding in the U.S. (FCC Regulations), Europe (by order in 1996), Japan (VCCI Guidelines). Electromagnetic shielding in the radio and microwave frequency ranges is especially desirable.

SUMMARY OF THE INVENTION

Nanoscale magnetic particles are useful in the production of materials to shield electronic components from EMI radiation. Preferably, the nanoscale particles are substantially crystalline. The small scale of the particles can lead to enhanced magnetic permeability. Generally, the particles are formed into a particle loaded film with particles embedded within a binder or as a layer on top of a material such as a polymer. The composite shielding material incorporating the nanoscale particles preferably has high magnetic permeability, high electrical conductivity and a high dielectric constant.

In a first aspect, the invention features a shielding material for electronic equipment including an EMI shielding composition, the EMI shielding composition including magnetic particles and a binder, the magnetic particles being substantially crystalline and having an average diameter less than about 1000 nm. The particles can have a distribution of diameters such that at least about 95 percent of the particles have a diameter greater than about 60 percent of the average diameter and less than about 140 percent of the average diameter. The particles can comprise a composition selected from the group consisting of $Fe_2O_3$, $Fe_3O_4$, $Fe_3C$, and $Fe_7C_3$. The magnetic particles can have an average diameter from about 5 nm to about 50 nm, and preferably from about 5 nm to about 20 nm.

In selected embodiments, the binder includes an electrical conductor. The electrical conductor can be a metal or an electrically conducting organic polymer such as doped polyacetylene, polyaniline, polypyrrole, polythiophene and polyphenylene vinylene. The shielding composition can be formed into a layer. The shielding material can further include a conducting layer adjacent to the layer formed by the shielding composition. The conducting layer can include an electrically conducting organic polymer. Alternatively, the shielding composition can be formed into a composite particle.

In another aspect, the invention features a method of shielding electromagnetic interference comprising the step of interposing magnetic particles between an electrical component to be shielded and potential sources of electromagnetic interference, the magnetic particles being substantially crystalline and having an average diameter less than about 1000 nm. The particles can have an average diameter from about 5 nm to about 50 nm. In addition, the particles can have a distribution of diameters such that at least about 95 percent of the particles have a diameter greater than about 60 percent of the average diameter and less than about 140 percent of the average diameter. The particles can include a composition selected from the group consisting of $Fe_2O_3$, $Fe_3O_4$, $Fe_3C$, and $Fe_7C_3$. In some embodiments, the particles are held in a binder.

In another aspect, the invention features a method of producing iron oxide particles including the step of pyrolizing a molecular stream comprising an iron precursor, an oxidizing agent and a radiation absorbing gas in a reaction chamber, where the pyrolysis is driven by heat absorbed from a laser beam. The laser beam preferably is generated by a $CO_2$ laser. The oxidizing gas can be selected from the group consisting of $O_2$, $O_3$, $CO$, $CO_2$ and mixtures thereof. The molecular stream preferably is generated by a nozzle elongated in one dimension.

Other features and advantages of the invention are evident from the detailed description and claims presented below.

DESCRIPTION OF THE PREFERRED EMBODIMENTS

Figure 1:
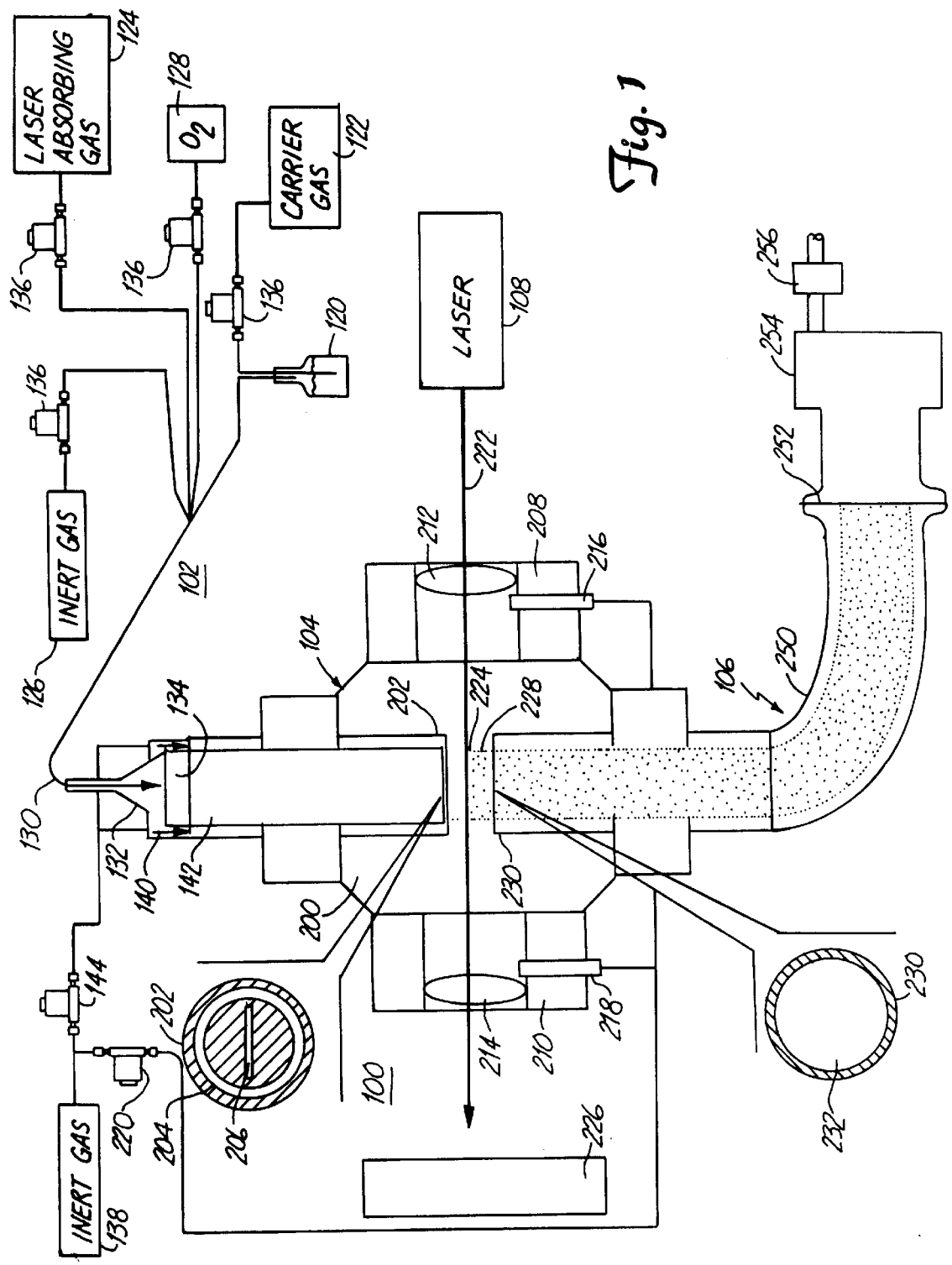
FIG. 1 is a schematic, sectional view of an embodiment of a laser pyrolysis apparatus taken through the middle of the laser radiation path. The upper insert is a bottom view of the injection nozzle, and the lower insert is a top view of the collection nozzle.

The present invention incorporates very small magnetic particles in the production of shielding material effective against electromagnetic interference. Furthermore, the small particles generally have high levels of crystallinity. The magnetic particles can be ferromagnetic or ferrimagnetic. Due to their small size, magnetic properties and crystallinity, the particles are well suited for the production of shielding materials. These particles can be incorporated into composite materials that result in a shielding material with useful properties.

Shielding based on absorption of radiation is preferred to shielding based on reflection of the radiation since reflected radiation can interfere with other nearby electronics. Preferred shielding materials have a high electrical conductivity, a high magnetic permeability and a high dielectric constant. This combination of properties yields high absorption of EMI radiation. Generally, a single material does not provide all of these properties, so composites of various forms are valuable.

The preferred magnetic particles provide high magnetic permeability to a composite material into which they are incorporated. Electrical conductivity can be contributed by the magnetic particles, but generally any electrical conductivity is contributed by another element of the composite material or shielding material generally, as described below. The composite material generally can be shaped appropriately for a particular shielding application. Other components of the shielding material such as the binder holding the magnetic particles can be electrically conductive to impart additional EMI shielding properties to the material.

The small size and crystallinity of the particles, as described below, leads to relatively high magnetic permeability. The magnetic particles preferably are formed from known magnetic materials, including, for example, $Fe_2O_3$, $Fe_3O_4$, $Fe_3C$ and $Fe_7C_3$.

Laser pyrolysis is an excellent process for efficiently producing suitable magnetic particles with narrow distributions of average particle diameters. A basic feature of the application of laser pyrolysis, as discussed below, for the production of appropriate small scale particles is production of a molecular stream containing a metal compound precursor, a radiation absorber and a reactant serving as an oxygen or carbon source. The molecular stream is pyrolyzed by an intense laser beam.

The intense heat resulting from the absorption of the laser radiation induces the reaction of the metal precursor compound in the selected oxygen or carbon environment. Laser pyrolysis provides for formation of phases of metal compounds that may be difficult to form under thermodynamic equilibrium conditions. As the molecular stream leaves the laser beam, the particles are rapidly quenched.

A. Particle Production

Laser pyrolysis has been discovered to be a valuable tool for the production of nanoscale metal oxide and metal carbide particles of interest. In addition, the particles produced by laser pyrolysis are a convenient material for further processing to expand the pathways for the production of desirable metal compound particles. Thus, using laser pyrolysis alone or in combination with additional processes, a wide variety of metal oxide and metal carbide particles can be produced. In some cases, alternative production pathways can be followed to produce comparable particles.

The reaction conditions determine the qualities of the particles produced by laser pyrolysis. The reaction conditions for laser pyrolysis can be controlled relatively precisely in order to produce particles with desired properties. The appropriate reaction conditions to produce a certain type of particles generally depend on the design of the particular apparatus. Nevertheless, some general observations on the relationship between reaction conditions and the resulting particles can be made.

Increasing the laser power results in increased reaction temperatures in the reaction region as well as a faster quenching rate. A rapid quenching rate tends to favor production of high energy structures. Similarly, increasing the chamber pressure also tends to favor the production of higher energy structures, such as $Fe_3C$. Also, increasing the concentration of the reactant serving as the oxygen or carbon source in the reactant stream favors the production of metal oxides or carbides with increased amounts of oxygen or carbon relative to metal in the composition of the particles.

Reactant gas flow rate and velocity of the reactant gas stream are inversely related to particle size so that increasing the reactant gas flow rate or velocity tends to result in a smaller average particle size. Also, the growth dynamics of the particles have a significant influence on the size of the resulting particles. In other words, different crystal forms of a product compound have a tendency to form different size particles from other crystal forms under relatively similar conditions. Laser power also influences particle size with increased laser power favoring larger particle formation for lower melting materials and smaller particle formation for higher melting materials.

Appropriate metal precursor compounds generally include metal compounds with reasonable vapor pressures, i.e., vapor pressures sufficient to get desired amounts of precursor vapor in the reactant stream. The vessel holding the precursor compounds can be heated to increase the vapor pressure of the metal precursor compound, if desired. Preferred iron precursors include, for example, $Fe(CO)_5$.

Preferred oxygen sources include, for example, $O_2$, CO, $CO_2$, $O_3$ and mixtures thereof. Preferred carbon sources include, for example, $C_2H_4$. The compound from the oxygen or carbon source should not react significantly with the metal precursor compound prior to entering the reaction zone since this generally would result in the formation of large particles.

Laser pyrolysis can be performed with a variety of optical laser frequencies. Preferred lasers operate in the infrared portion of the electromagnetic spectrum. $CO_2$ lasers are particularly preferred sources of laser light. Infrared absorbers for inclusion in the molecular stream include, for example, $C_2H_4$, $NH_3$, $SF_6$, $SiH_4$ and $O_3$. $O_3$ can act as both an infrared absorber and as an oxygen source. Similarly, $C_2H_4$ can act as both a infrared absorber and as a carbon source. The radiation absorber, such as the infrared absorber, absorbs energy from the radiation beam and distributes the energy to the other reactants to drive the pyrolysis.

Preferably, the energy absorbed from the radiation beam increases the temperature at a tremendous rate, many times the rate that energy generally would be produced even by strongly exothermic reactions under controlled condition. While the process generally involves nonequilibrium conditions, the temperature can be described approximately based on the energy in the absorbing region. The laser pyrolysis process is qualitatively different from the process in a combustion reactor where an energy source initiates a reaction, but the reaction is driven by energy given off by an exothermic reaction.

An inert shielding gas can be used to reduce the amount of reactant and product molecules contacting the reactant chamber components. Appropriate shielding gases include, for example, Ar, He and $N_2$.

The production of iron carbides by laser pyrolysis has been described in Bi et al., "Nanocrystalline α-Fe, $Fe_3C$, and $Fe_7C_3$ produced by $CO_2$ laser pyrolysis," J. Mater. Res. 8:1666–1674 (1993), incorporated herein by reference.

An appropriate laser pyrolysis apparatus generally includes a reaction chamber isolated from the ambient environment. A reactant inlet connected to a reactant supply system produces a molecular stream through the reaction chamber. A laser beam path intersects the molecular stream at a reaction zone. The molecular stream continues after the reaction zone to an outlet, where the molecular stream exits the reaction chamber and passes into a collection system. Generally, the laser is located external to the reaction chamber, and the laser beam enters the reaction chamber through an appropriate window.

Referring to FIG. 1, a particular embodiment 100 of a pyrolysis apparatus involves a reactant supply system 102, reaction chamber 104, collection system 106 and laser 108. Reactant supply system 102 includes a source 120 of precursor compound. For liquid precursors, a carrier gas from carrier gas source 122 can be introduced into precursor source 120, containing liquid precursor to facilitate delivery of the precursor. The carrier gas from source 122 preferably is either an infrared absorber or an inert gas and is preferably bubbled through the liquid, precursor compound. The quantity of precursor vapor in the reaction zone is roughly proportional to the flow rate of the carrier gas.

Alternatively, carrier gas can be supplied directly from infrared absorber source 124 or inert gas source 126, as appropriate. The reactant providing the oxygen or carbon is supplied from source 128, which can be a gas cylinder or other appropriate container. The gases from the precursor source 120 are mixed with gases from reactant source 128, infrared absorber source 124 and inert gas source 126 by combining the gases in a single portion of tubing 130. The gases are combined a sufficient distance from reaction chamber 104 such that the gases become well mixed prior to their entrance into reaction chamber 104. The combined gas in tube 130 passes through a duct 132 into rectangular channel 134, which forms part of an injection nozzle for directing reactants into the reaction chamber.

Flow from sources 122, 124, 126 and 128 are preferably independently controlled by mass flow controllers 136. Mass flow controllers 136 preferably provide a controlled flow rate from each respective source. Suitable mass flow controllers include, for example, Edwards Mass Flow Controller, Model 825 series, from Edwards High Vacuum International, Wilmington, Mass.

Inert gas source 138 is connected to an inert gas duct 140, which flows into annular channel 142. A mass flow controller 144 regulates the flow of inert gas into inert gas duct 140. Inert gas source 126 can also function as the inert gas source for duct 140, if desired.

The reaction chamber 104 includes a main chamber 200. Reactant supply system 102 connects to the main chamber 200 at injection nozzle 202. The end of injection nozzle 202 has an annular opening 204 for the passage of inert shielding gas, and a rectangular slit 206 for the passage of reactant gases to form a molecular stream in the reaction chamber. Annular opening 204 has, for example, a diameter of about 1.5 inches and a width along the radial direction of about 1/16 in. The flow of shielding gas through annular opening 204 helps to prevent the spread of the reactant gases and product particles throughout reaction chamber 104.

Tubular sections 208, 210 are located on either side of injection nozzle 202. Tubular sections 208, 210 include ZnSe windows 212, 214, respectively. Windows 212, 214 are about 1 inch in diameter. Windows 212, 214 are preferably plane-focusing lenses with a focal length equal to the distance between the center of the chamber to the surface of the lens to focus the beam to a point just below the center of the nozzle opening. Windows 212, 214 preferably have an antireflective coating. Appropriate ZnSe lenses are available from Janos Technology, Townshend, Vt. Tubular sections 208, 210 provide for the displacement of windows 212, 214 away from main chamber 200 such that windows 212, 214 are less likely to be contaminated by reactants or products. Window 212, 214 are displaced, for example, about 3 cm from the edge of the main chamber 200.

Windows 212, 214 are sealed with a rubber o-ring to tubular sections 208, 210 to prevent the flow of ambient air into reaction chamber 104. Tubular inlets 216, 218 provide for the flow of shielding gas into tubular sections 208, 210 to reduce the contamination of windows 212, 214. Tubular inlets 216, 218 are connected to inert gas source 138 or to a separate inert gas source. In either case, flow to inlets 216, 218 preferably is controlled by a mass flow controller 220.

Laser 108 is aligned to generate a laser beam 222 that enters window 212 and exits window 214. Windows 212, 214 define a laser light path through main chamber 200 intersecting the flow of reactants at reaction zone 224. After exiting window 214, laser beam 222 strikes power meter 226, which also acts as a beam dump. An appropriate power meter is available from Coherent Inc., Santa Clara, Calif. Laser 108 can be replaced with an intense conventional light source such as an arc lamp. Preferably, laser 108 is an infrared laser, especially a CW $CO_2$ laser such as an 1800 watt maximum power output laser available from PRC Corp., Landing, N.J. or a Coherent® model 525 (Coherent, Inc., Santa Clara, Calif.) with a maximum power output of 375 watts.

Reactants passing through slit 206 in injection nozzle 202 initiate a molecular stream. The molecular stream passes through reaction zone 224, where reaction involving the precursor compound takes place. Heating of the gases in reaction zone 224 is extremely rapid, roughly on the order of $10^{5°}$ C./sec depending on the specific conditions. The reaction is rapidly quenched upon leaving reaction zone 224, and nanoparticles 228 are formed in the molecular stream. The nonequilibrium nature of the process allows for the production of nanoparticles with a highly uniform size distribution and structural homogeneity.

The path of the molecular stream continues to collection nozzle 230. Collection nozzle 230 is spaced about 2 cm from injection nozzle 202. The small spacing between injection nozzle 202 and collection nozzle 230 helps reduce the contamination of reaction chamber 104 with reactants and products. Collection nozzle 230 has a circular opening 232. Circular opening 232 feeds into collection system 106.

The chamber pressure is monitored with a pressure gauge attached to the main chamber. The chamber pressure generally ranges from about 5 Torr to about 1000 Torr. The preferred chamber pressure for the production of the desired oxides and carbides ranges from about 80 Torr to about 500 Torr.

Reaction chamber 104 has two additional tubular sections not shown. One of the additional tubular sections projects into the plane of the sectional view in FIG. 1, and the second additional tubular section projects out of the plane of the sectional view in FIG. 1. When viewed from above, the four tubular sections are distributed roughly, symmetrically around the center of the chamber. These additional tubular sections have windows for observing the inside of the chamber. In this configuration of the apparatus, the two additional tubular sections are not used to facilitate production of nanoparticles.

Collection system 106 can include a curved channel 250 leading from collection nozzle 230. Because of the small size of the particles, the product particles follow the flow of the gas around curves. Collection system 106 includes a filter 252 within the gas flow to collect the product particles. A variety of materials such as teflon, glass fibers and the like can be used for the filter as long as the material is inert and has a fine enough mesh to trap the particles. Preferred materials for the filter include, for example, a glass fiber filter from ACE Glass Inc., Vineland, N.J.

Pump 254 is used to maintain collection system 106 at a reduced pressure. A variety of different pumps can be used.

Appropriate pumps 254 include, for example, Busch Model B0024 pump from Busch, Inc., Virginia Beach, Va. with a pumping capacity of about 25 cubic feet per minute (cfm) and Leybold Model SV300 pump from Leybold vacuum Products, Export, Pa. with a pumping capacity of about 195 cfm. It may be desirable to flow the exhaust of the pump through a scrubber 256 to remove any remaining reactive chemicals before venting into the atmosphere. The entire apparatus 100 can be placed in a fume hood for ventilation purposes and for safety considerations. Generally, the laser remains outside of the fume hood because of its large size.

The apparatus is controlled by a computer. Generally, the computer controls the laser and monitors the pressure in the reaction chamber. The computer can be used to control the flow of reactants and/or the shielding gas. The pumping rate is controlled by either a manual needle valve or an automatic throttle valve inserted between pump 254 and filter 252. As the chamber pressure increases due to the accumulation of particles on filter 252, the manual valve or the throttle valve can be adjusted to maintain the pumping rate and the corresponding chamber pressure.

The reaction can be continued until sufficient particles are collected on filter 252 such that the pump can no longer maintain the desired pressure in the reaction chamber 104 against the resistance through filter 252. When the pressure in reaction chamber 104 can no longer be maintained at the desired value, the reaction is stopped, and the filter 252 is removed. With this embodiment, about 3–75 grams of nanoparticles can be collected in a single run before the chamber pressure can no longer be maintained. A single run generally can last from about 10 minutes to about 3 hours depending on the type of particle being produced and the particular filter. Therefore, it is straightforward to produce a macroscopic quantity of particles, i.e., a quantity visible with the naked eye.

The reaction conditions can be controlled relatively precisely. The mass flow controllers are quite accurate. The laser generally has about 0.5 percent power stability. With either a manual control or a throttle valve, the chamber pressure can be controlled to within about 1 percent.

The configuration of the reactant supply system 102 and the collection system 106 can be reversed. In this alternative configuration, the reactants are supplied from the bottom of the reaction chamber, and the product particles are collected from the top of the chamber. This alternative configuration can result in a slightly higher collection of product for particles that are buoyant in the surrounding gases. In this configuration, it is preferable to include a curved section in the collection system so that the collection filter is not mounted directly above the reaction chamber.

An alternative design of a laser pyrolysis apparatus has been described. See, commonly assigned U.S. patent application Ser. No. 08/808,850, entitled "Efficient Production of Particles by Chemical Reaction," incorporated herein by reference. This alternative design is intended to facilitate production of commercial quantities of particles by laser pyrolysis. A variety of configurations are described for injecting the reactant materials into the reaction chamber.

The alternative apparatus includes a reaction chamber designed to minimize contamination of the walls of the chamber with particles, to increase the production capacity and to make efficient use of resources. To accomplish these objectives, the reaction chamber conforms generally to the shape of an elongated reactant inlet, decreasing the dead volume outside of the molecular stream. Gases can accumulate in the dead volume, increasing the amount of wasted radiation through scattering or absorption by nonreacting molecules. Also, due to reduced gas flow in the dead volume, particles can accumulate in the dead volume causing chamber contamination.

Figure 2:
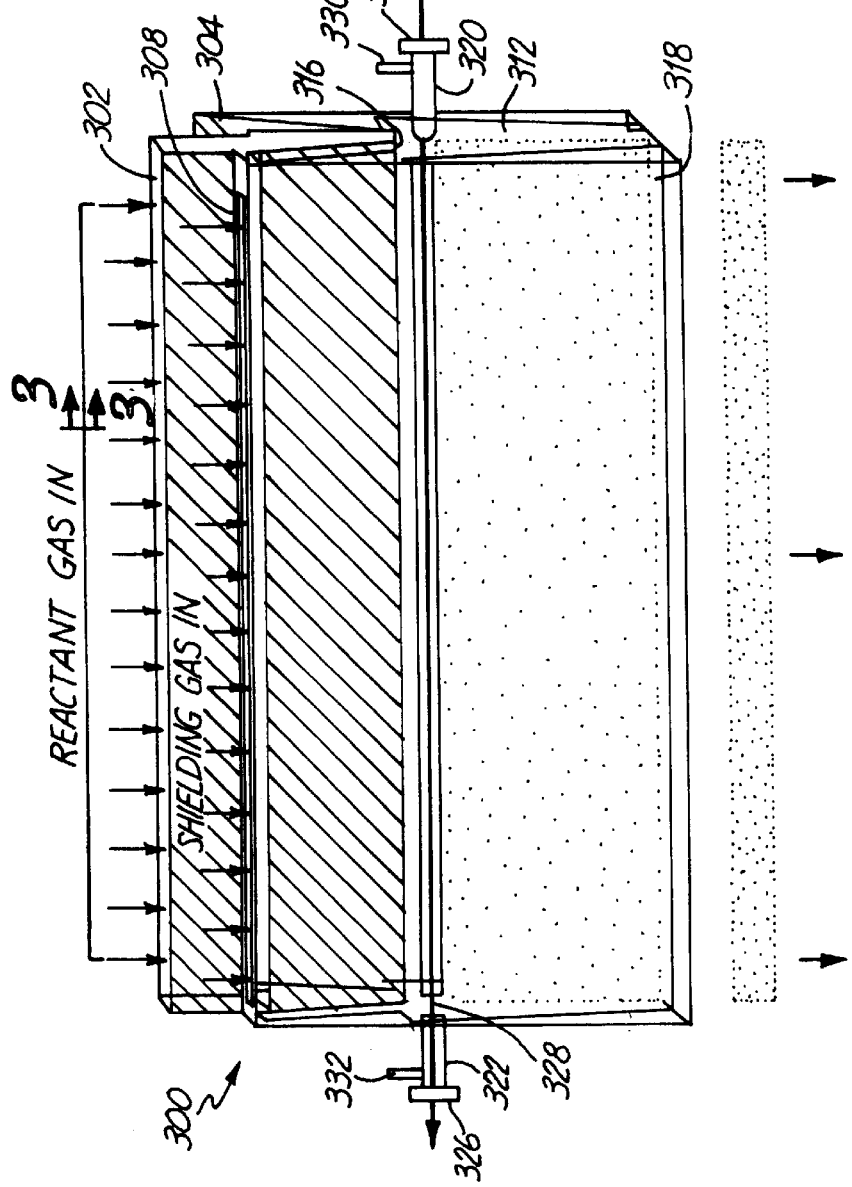
FIG. 2 is a schematic, perspective view of a reaction chamber of an alternative embodiment of the laser pyrolysis apparatus, where the materials of the chamber are depicted as transparent to reveal the interior of the apparatus.
Figure 3:
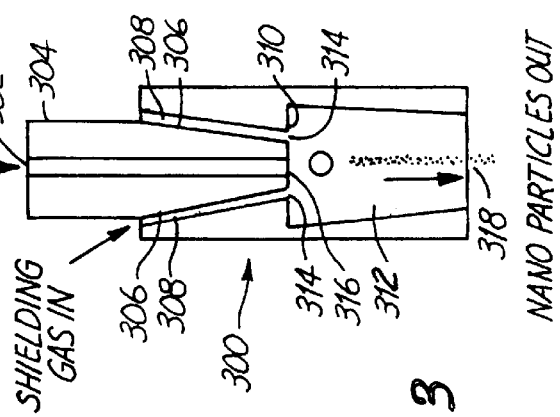
FIG. 3 is a sectional view of the reaction chamber of FIG. 2 taken along line 3—3.

The design of the improved reaction chamber 300 is schematically shown in FIGS. 2 and 3. A reactant gas channel 302 is located within block 304. Facets 306 of block 304 form a portion of conduits 308. Another portion of conduits 308 join at edge 310 with an inner surface of main chamber 312. Conduits 308 terminate at shielding gas inlets 314. Block 304 can be repositioned or replaced, depending on the reaction and desired conditions, to vary the relationship between the elongated reactant inlet 316 and shielding gas inlets 314. The shielding gases from shielding gas inlets 314 form blankets around the molecular stream originating from reactant inlet 316.

The dimensions of elongated reactant inlet 316 preferably are designed for high efficiency particle production. Reasonable dimensions for the reactant inlet for the production of the relevant oxide, sulfide and carbide particles, when used with a 1800 watt $CO_2$ laser, are from about 5 mm to about 1 meter.

Main chamber 312 conforms generally to the shape of elongated reactant inlet 316. Main chamber 312 includes an outlet 318 along the molecular stream for removal of particulate products, any unreacted gases and inert gases. Tubular sections 320, 322 extend from the main chamber 312. Tubular sections 320, 322 hold windows 324, 326 to define a laser beam path 328 through the reaction chamber 300. Tubular sections 320, 322 can include shielding gas inlets 330, 332 for the introduction of shielding gas into tubular sections 320, 322.

The improved apparatus includes a collection system to remove the particles from the molecular stream. The collection system can be designed to collect a large quantity of particles without terminating production or, preferably, to run in continuous production by switching between different particle collectors within the collection system. The collection system can include curved components within the flow path similar to curved portion of the collection system shown in FIG. 1. The configuration of the reactant injection components and the collection system can be reversed such that the particles are collected at the top of the apparatus.

As noted above, properties of the metal compound particles can be modified by further processing. For example, metal oxide or metal carbide nanoparticles can be heated in an oven in an oxygen environment or an inert environment to alter the oxygen content and/or crystal structure of the particles. In addition, the heating process can be used possibly to remove adsorbed compounds on the particles to increase the quality of the particles. It has been discovered that use of mild conditions, i.e., temperatures well below the melting point of the nanoparticles, results in modification of the stoichiometry or crystal structure of particles without significantly sintering the nanoparticles into larger particles. This processing in an oven is further discussed in commonly assigned and simultaneously filed, U.S. patent application Ser. No. 08/897,903, entitled "Processing of Vanadium Oxide Particles With Heat," incorporated herein by reference.

Figure 4:
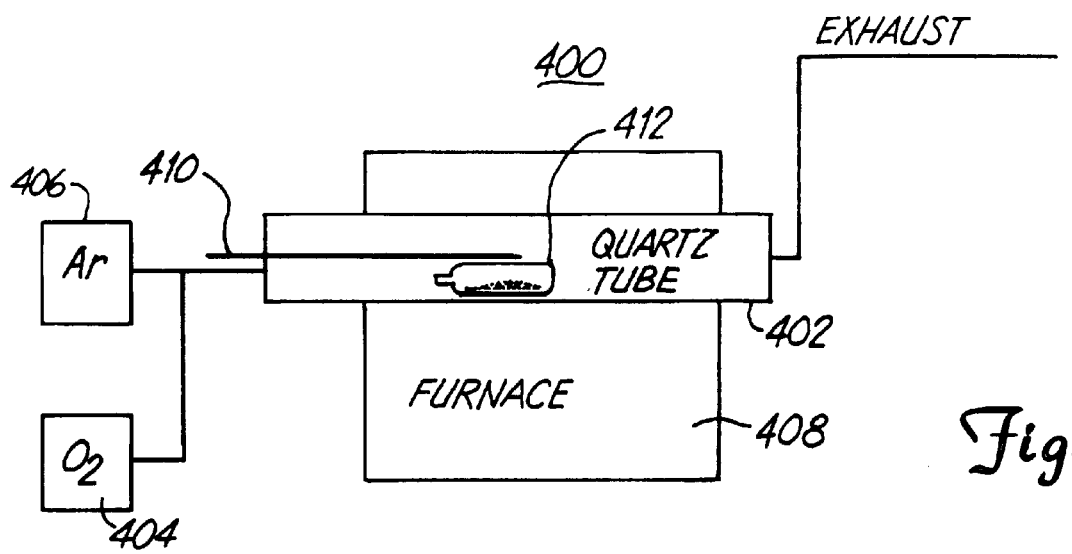
FIG. 4 is a schematic, sectional view of an oven for heating vanadium oxide particles, in which the section is taken through the center of the quartz tube.

An example of an apparatus 400 to perform this processing is displayed in FIG. 4. Apparatus 400 includes a tube 402 into which the particles are placed. Tube 402 is connected to an reactant gas source 404 and inert gas source 406. Reactant gas, inert gas or a combination thereof to produce the desired atmosphere are placed within tube 402.

Preferably, the desired gases are flowed through tube 402. Appropriate active gases to produce an oxygen environment (reactant gas) include, for example, $O_2$, $O_3$, CO, $CO_2$ and combinations thereof. The reactant gases can be diluted with inert gases such as Ar, He and $N_2$. The gases in tube 402 can be exclusively inert gases, if desired.

Tube 402 is located within oven or furnace 408. Oven 408 maintains the relevant portions of the tube at a relatively constant temperature, although the temperature can be varied systematically through the processing step, if desired. Temperature in oven 408 generally is measured with a thermocouple 410. The particles can placed in tube 402 within a vial 412. Vial 412 prevents loss of the particles due to gas flow. Vial 412 generally is oriented with the open end directed toward the direction of the source of the gas flow.

The precise conditions including type of reactant gas (if any), concentration of reactant gas, pressure or flow rate of gas, temperature and processing time can be selected to produce the desired type of product material. The temperatures generally are mild, i.e., significantly below the melting point of the material. The use of mild conditions avoids interparticle sintering resulting in larger particle sizes. Some controlled sintering of the metal oxide particles can be performed in oven 408 at somewhat higher temperatures to produce slightly larger average particle diameters.

The temperatures preferably range from about 50° C. to about 1000° C., and more preferably from about 50° C. to about 400° C. and even more preferably from about 50° C. to about 300° C. The particles preferably are heated for about 1 hour to about 100 hours. Some empirical adjustment may be required to produce the conditions appropriate for yielding a desired material.

B. Particle Properties

A collection of preferred particles has an average diameter of less than a micron, preferably from about 5 nm to about 500 nm and more preferably from about 5 nm to about 100 nm, and even more preferably from about 5 nm to about 50 nm. The particles generally have a roughly spherical gross appearance. Upon closer examination, the particles generally have facets corresponding to the underlying crystal lattice. Nevertheless, the particles tend to exhibit growth that is roughly equal in the three physical dimensions to give a gross spherical appearance. Diameter measurements on particles with asymmetries are based on an average of length measurements along the principle axes of the particle. The measurements along the principle axes preferably are each less than about 1 micron for at least about 95 percent of the nanoparticles, and more preferably for at least about 98 percent of the nanoparticles.

Because of their small size, the particles tend to form loose agglomerates due to van der Waals forces and magnetic interactions between nearby particles. Nevertheless, the nanometer scale of the particles (i.e., primary particles) is clearly observable in transmission electron micrographs of the particles. For crystalline particles, the particle size generally corresponds to the crystal size. The particles generally have a surface area corresponding to particles on a nanometer scale as observed in the micrographs. Furthermore, the particles manifest unique properties due to their small size and large surface area per weight of material.

As produced, the particles preferably have a high degree of uniformity in size. As determined from examination of transmission electron micrographs, the particles generally have a distribution in sizes such that at least about 95 percent of the particles have a diameter greater than about 40 percent of the average diameter and less than about 160 percent of the average diameter. Preferably, the particles have a distribution of diameters such that at least about 95 percent of the particles have a diameter greater than about 60 percent of the average diameter and less than about 140 percent of the average diameter. The narrow size distributions can be exploited in a variety of applications, as described below. For some of the applications, it may be desirable to mix several collections of particles, each having a narrow diameter distribution, to produce a desired distribution of particle diameters.

In addition, the nanoparticles generally have a very high purity level. Metal oxide or metal carbide particles produced by the above methods are expected to have a purity greater than the reactant gases because the crystal formation process tends to exclude contaminants from the lattice. Furthermore, metal compound particles produced by laser pyrolysis have been found to have a high degree of crystallinity. With substantially crystalline particles, the lattice image is clearly visible in a electron micrograph of appropriate magnification.

Under most reaction conditions, the particle generally have a single crystalline phase. The particles can have a single crystalline phase comprising at least about 90 percent by weight. The particles preferably have a single crystalline phase uniformity of at least about 95 percent by weight, more preferably at least about 99 percent by weight and even more preferably at least about 99.9 percent by weight.

Iron is known to exist in several different oxidation states. For example, iron oxides are known with stoichiometries of, for example, FeO (cubic crystal), $Fe_3O_4$ (cubic crystal, inverse-spinel structure) and $Fe_2O_3$ ($\alpha$-trigonal crystal, $\gamma$-cubic crystal, spinel structure). Similarly, iron carbides have been observed with stoichiometries of $Fe_3C$ (cementite-orthorhombic), $Fe_7C_3$ (hexagonal, pseudo-hexagonal or orthorhombic), $Fe_5C_2$ (Hagg carbide—monoclinic), $Fe_2C$ (cementite-orthorhombic), $Fe_{20}C_9$, $Fe_4C$ and $\epsilon$-carbide ($Fe_xC$, 2<x<3, hexagonal). The conditions used in laser pyrolysis can be altered to select from these different forms of the iron compounds. The conditions in a particular apparatus for the selection production between $Fe_3C$ and $Fe_7C_3$, have been described by Bi et al., supra.

C. Electromagnetic Shielding

Shielding materials can be used to protect sensitive electronics from EMI. The shielding material generally is effective at shielding components from electromagnetic radiation with frequencies greater than about 1 kilohertz and preferably with frequencies greater than about 1 megahertz. If the shielding material has sufficient strength, the shielding material also can form an encasement for the electronic device, otherwise the shielding material may be combined, e.g., as a layer, with another material to form an encasement material with sufficient mechanical strength. Alternatively, the shielding material can surround the electronics or a sensitive portion of the electronics independently from any other structural enclosure of the electronics.

Figure 5:
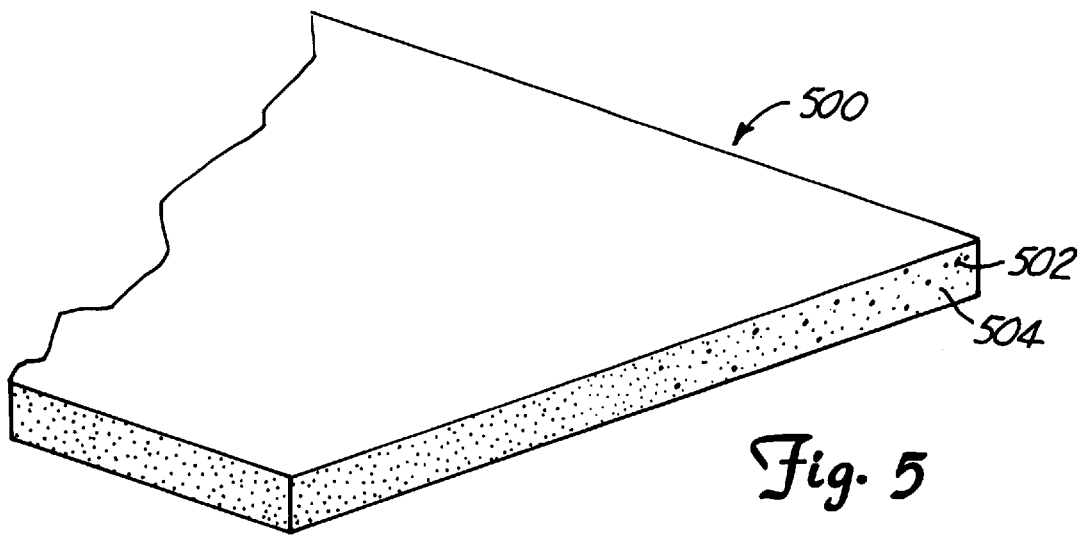
FIG. 5 is a fragmentary, perspective view of a shielding material.

The shielding material generally includes a particle loaded layer 500. Particle loaded layer 500 includes magnetic particles 502 that are imbedded in a binder 504, as schematically shown in FIG. 5. Alternatively, the particles can be placed as a layer on a surface of the binder. The binder can be electrically conducting or electrically nonconducting.

The particle loaded film 500 forms a shielding material or a component of a shielding material. The shielding material should inhibit transmission of electromagnetic interference at least over a desired frequency range of the electromagnetic spectrum. Preferably, the shielding material is highly absorptive of electromagnetic radiation in the selected portion of the frequency spectrum.

Preferred magnetic particles include the nanoscale particles described above. The particles can be selected to absorb electromagnetic radiation in a desired frequency range, preferably in a relatively high frequency range. A mixture of particles can be used if a broader range of absorption is desired than is obtained with a single batch of particles. Generally, the loading of particles in the material can be adjusted to provide adequate shielding for a particular use.

Because of the small size of nanoscale particles, they can pack tightly in the film upon disruption of weakly bound aggregates. Tight packing can lead to good shielding properties since radiation is less likely to propagate between particles. This packing behavior can lead to the use of less weight of shielding material to provide sufficient EMI shielding. Furthermore, shielding incorporating nanoparticles can better conform to structural features of an encasements, such as corners, without providing leakage of radiation. The nanoscale particles are conducive to the formation of smooth films with very small thicknesses.

Binder 504 can be a polymer, including any of a variety of polymers that can be filled with particles and formed into a film. Suitable polymers include vinyl and non-vinyl polymers. Appropriate vinyl polymers include, for example, polyolefins such as polyethylene and polypropylene, fluoropolymers such as polytetrafluoethylene (Teflon®) and polyvinylidene fluoride, and copolymers and mixtures thereof. Appropriate non-vinyl polymers include, for example, polyesters such as polymethylmethacrylate, and polyurethane. Useful polymers also include electrically conducting polymers such as doped polyacetylene, polyaniline, polypyrrole, polythiophene and polyphenylene vinylene. Several conducting polymers also have high dielectric constants.

The polymers can include various property modifiers to improve processing or durability such as plasticizers and antioxidants. Small quantities of other particulate fillers can be used to improve the mechanical properties and/or electrical conductivity, if desired. In addition, the polymer films can include conducting particles such as carbon fibers, carbon black, graphite or metal particles.

Alternatively, soft metals such as indium and gold can act as binders. The particles can be embedded into the soft metals. If the metals have melting points below the melting point of the magnetic particle, the magnetic particles can be mixed with the melted metal and forming into a desired shape.

Figure 6:
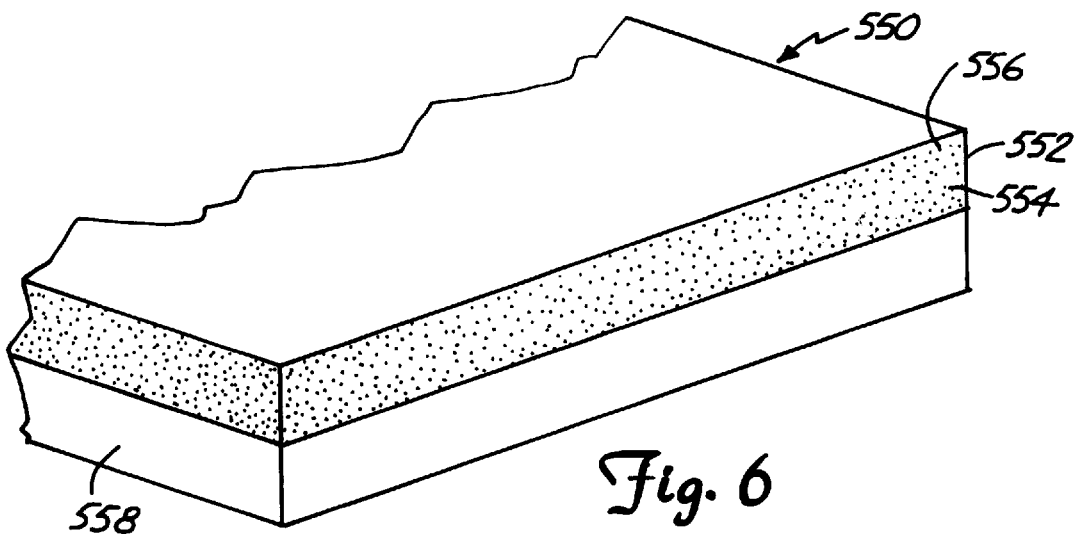
FIG. 6 is a fragmentary, perspective view of a two layer shielding material.

In an alternative embodiment 550, the shielding material includes two layers, as schematically shown in FIG. 6. A shielding composition in first layer 552 includes magnetic particles 554 held in a polymer matrix 556. First layer 552 is similar to particle layer 500 shown in FIG. 5. First layer 552 optionally can include electrically conductive components. A second, conductive layer 558 includes electrically conductive components. Second layer 558 can be formed from a conductive metal. For example, second layer 558 can be a metal layer adjacent to the first, magnetic particle layer. Alternatively, second layer 558 can be a polymer film. The polymer film in layer 558 can include a conducting polymer. Whether or not layer 558 includes a conducting polymer, the conductive layer 558 can include conductive particles, such as carbon fibers, carbon black, metal particles and graphite.

Figure 7:
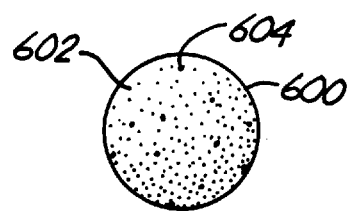
FIG. 7 is a cross sectional view of a composite particle involving magnetic particles and a binder.

The magnetic particles can be formed into larger composite particles for formation into the shielding material. Referring to FIG. 7, composite particle 600 includes a conductive binder 602 containing magnetic particles 604. The conductive binder 602 can be a conductive polymer or a metal. The composite particle generally is still relatively small, with diameters on the order of a millimeter or less. Composite particles 600 can be blended with a binder to form a layer. This layer is similar to the particle loaded layer shown in FIG. 5 with the composite particles substituted for the magnetic particles. Alternatively, composite particles 600 can be mixed into a liquid to form a solution that is sprayed or spin coated onto a surface to form a shielding material.

The embodiments described above are intended to be representative and not limiting. Additional embodiments of the invention are within the claims. As will be understood by those skilled in the art, many changes in the methods and apparatus described above may be made by the skilled practitioner without departing from the spirit and scope of the invention, which should be limited only as set forward in the claims which follow.

What is claimed is:

1. A shielding material for electromagnetic equipment comprising an EMI shielding composition, the EMI shielding composition comprising magnetic particles and a binder, the magnetic particles being substantially crystalline and having both an average diameter less than about 1000 nm and a distribution of diameters such that at least about 95 percent of the particles have a diameter greater than about 40 percent of the average diameter and less than about 160 percent of the average diameter.

2. The shielding material of claim 1 wherein the particles have a distribution of diameters such that at least about 95 percent of the particles have a diameter greater than about 60 percent of the average diameter and less than about 140 percent of the average diameter.

3. The shielding material of claim 1 wherein the particles comprise a composition selected from the group consisting of $Fe_2O_3$, $Fe_3O_4$, $Fe_3C$, and $Fe_7C_3$.

4. The shielding material of claim 1 wherein the binder comprises an electrical conductor.

5. The shielding material of claim 1 wherein the binder comprises an electrically conducting organic polymer.

6. The shielding material of claim 1 wherein the conducting organic polymer is selected from the group consisting of doped polyacetylene, polyaniline, polypyrrole, polythiophene and polyphenylene vinylene.

7. The shielding material of claim 1 wherein the binder comprises a metal.

8. The shielding material of claim 1 wherein the shielding composition is formed into a layer.

9. The shielding material of claim 8 further comprising a conducting layer adjacent to the layer formed by the shielding composition.

10. The shielding material of claim 9 wherein the conducting layer comprises an electrically conducting organic polymer.

11. The shielding material of claim 1 wherein the shielding composition is formed into a composite particle.

12. The shielding material of claim 1 wherein the particles have an average diameter from about 5 nm to about 50 nm.

13. The shielding material of claim 1 wherein the particles have an average diameter from about 5 nm to about 20 nm.

14. A method of shielding electromagnetic interference comprising the step of interposing magnetic particles between an electrical component to be shielded and potential sources of electromagnetic interference, the magnetic particles being substantially crystalline and having an average diameter less than about 1000 nm and having a distribution of diameters such that at least about 95 percent of the particles have a diameter greater than about 40 percent of the average diameter and less than about 160 percent of the average diameter, wherein said magnetic particles are held in a binder.

15. The method of claim 14 wherein the particles have an average diameter from about 5 nm to about 50 nm.

* * * * *